United States Patent
Kang et al.

(10) Patent No.: US 11,048,319 B2
(45) Date of Patent: Jun. 29, 2021

(54) DATA PROCESSING DEVICE TO ADJUST SIZE OF DATA COMMUNICATED TO MEMORY DEVICE AND DATA PROCESSING METHOD

(71) Applicant: SAMSUNG ELECTRONICS CO., LTD., Suwon-si (KR)

(72) Inventors: Hyun-Gu Kang, Suwon-si (KR); Se-Hyoung Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 47 days.

(21) Appl. No.: 16/457,132

(22) Filed: Jun. 28, 2019

(65) Prior Publication Data
US 2020/0097175 A1 Mar. 26, 2020

(30) Foreign Application Priority Data

Sep. 21, 2018 (KR) .................. 10-2018-0114372

(51) Int. Cl.
| | |
|---|---|
| G06F 1/3234 | (2019.01) |
| G06F 13/16 | (2006.01) |
| H03M 13/39 | (2006.01) |
| H03M 13/00 | (2006.01) |
| H03M 7/30 | (2006.01) |
| H04L 1/20 | (2006.01) |

(52) U.S. Cl.
CPC ........ *G06F 1/3275* (2013.01); *G06F 13/1668* (2013.01); *H03M 7/3059* (2013.01); *H03M 7/6094* (2013.01); *H03M 13/3927* (2013.01); *H03M 13/6362* (2013.01); *H04L 1/20* (2013.01); *G06F 2212/1028* (2013.01); *G06F 2212/401* (2013.01)

(58) Field of Classification Search
None
See application file for complete search history.

(56) References Cited

U.S. PATENT DOCUMENTS

| | | | | |
|---|---|---|---|---|
| 5,524,248 | A | * | 6/1996 | Parks .................... G06F 1/3215 713/324 |
| 7,190,284 | B1 | * | 3/2007 | Dye ........................ H03M 7/30 341/51 |
| 7,590,095 | B2 | | 9/2009 | Chen et al. |
| 8,521,212 | B2 | | 8/2013 | Anderson |
| 9,439,217 | B2 | | 9/2016 | Feuersaenger et al. |
| 9,462,558 | B2 | | 10/2016 | Su et al. |
| 9,705,774 | B2 | | 7/2017 | Yi et al. |
| 2007/0291571 | A1 | * | 12/2007 | Balasundaram ........ H03M 7/30 365/227 |
| 2011/0111700 | A1 | | 5/2011 | Hackett |
| 2012/0135696 | A1 | | 5/2012 | Lerzer et al. |
| 2013/0314429 | A1 | * | 11/2013 | Croxford ............... G09G 5/393 345/531 |

(Continued)

*Primary Examiner* — Nathan Sadler
(74) *Attorney, Agent, or Firm* — F. Chau & Associates, LLC

(57) ABSTRACT

A data processing device communicating with a memory device via a memory interface includes: at least one data processor configured to generate first data; a data converter configured to generate second data written to the memory device from the first data; and a controller configured to enable the data converter to generate the second data having a size less than that of the first data.

18 Claims, 9 Drawing Sheets

38'

| Data Processor | Memory Interface Power | | | |
|---|---|---|---|---|
| | Conv. Disabled | Conv. Type 1 | Conv. Type 2 | Conv. Type 3 |
| DP1 | $P_{10}$ | $P_{11}$ | $P_{12}$ | $P_{13}$ |
| DP2 | $P_{20}$ | $P_{21}$ | $P_{22}$ | $P_{23}$ |
| ⋮ | ⋮ | ⋮ | ⋮ | ⋮ |
| DPn | $P_{n0}$ | $P_{n1}$ | $P_{n2}$ | $P_{n3}$ |

(56) References Cited

U.S. PATENT DOCUMENTS

| | | | |
|---|---|---|---|
| 2015/0121111 A1* | 4/2015 | Chun | G11C 11/4074 |
| | | | 713/324 |
| 2015/0339059 A1* | 11/2015 | Kang | G06F 3/064 |
| | | | 711/154 |
| 2016/0148670 A1* | 5/2016 | Quach | G06F 1/3287 |
| | | | 713/323 |
| 2017/0207884 A1 | 7/2017 | Jiang et al. | |
| 2017/0255394 A1* | 9/2017 | Suh | G06F 13/1668 |
| 2018/0210858 A1* | 7/2018 | Chu | G06F 15/781 |
| 2018/0300606 A1* | 10/2018 | Corkery | G06F 9/5077 |
| 2018/0301120 A1* | 10/2018 | Thaploo | G06F 3/14 |
| 2020/0026403 A1* | 1/2020 | Tamatam | G06F 3/167 |

\* cited by examiner

| Data Processor | Memory Interface Power | | | |
|---|---|---|---|---|
| | Conv. Disabled | Conv. Type 1 | Conv. Type 2 | Conv. Type 3 |
| DP1 | $P_{10}$ | $P_{11}$ | $P_{12}$ | $P_{13}$ |
| DP2 | $P_{20}$ | $P_{21}$ | $P_{22}$ | $P_{23}$ |
| ⋮ | ⋮ | ⋮ | ⋮ | ⋮ |
| DPn | $P_{n0}$ | $P_{n1}$ | $P_{n2}$ | $P_{n3}$ |

DATA PROCESSING DEVICE TO ADJUST SIZE OF DATA COMMUNICATED TO MEMORY DEVICE AND DATA PROCESSING METHOD

CROSS-REFERENCE TO RELATED APPLICATION

This U.S. non-provisional application claims priority to and the benefit of Korean Patent Application No. 10-2018-0114372, filed on Sep. 21, 2018, in the Korean Intellectual Property Office, the disclosure of which is incorporated by reference in its entirety herein.

BACKGROUND

1. Technical Field

The inventive concept relates to a data processing device, and more particularly, to a data processing device communicating with a memory device and a data processing method.

2. Discussion of Related Art

A data processing device may communicate with a memory device in order to store input data, output data, and intermediate data. The intermediate data is used to generate the output data from the input data and to use data stored in the memory device. The data processing device and the memory device may communicate with each other via a memory interface. For example, the data processing device may communicate with the memory device by sending and receiving electric signals via a plurality of signal lines. As the amount of data processed by the data processing device and an operating speed of the data processing device increase, communication with the memory device may frequently occur and a large amount of data may be transferred through the memory interface. Accordingly, power consumption of the memory device and the memory interface may noticeably increase.

SUMMARY

At least one embodiment of the inventive concept provides a data processing device having reduced power consumption in a memory device and a memory interface, and a data processing method.

According to an exemplary embodiment of the inventive concept, there is provided a data processing device configured to communicate with a memory device via a memory interface, the data processing device including: at least one data processor configured to generate first data; a data converter configured to generate second data written to the memory device from the first data; and a controller configured to enable the data converter to generate the second data having a size that is less than a size of the first data, to reduce power consumption of at least one of the memory device or the memory interface.

According to an exemplary embodiment of the inventive concept, there is provided a data processing device configured to process a signal transmitted through a communication channel, the data processing device including: a data processor configured to generate first data by processing the signal transmitted through the communication channel; a data converter configured to generate second data written to a memory device via the memory interface from the first data, configured to generate the second data having a size less than a size of the first data when being enabled, and configured to generate the second data that is the same as the first data when being disabled; and a controller configured to control the data converter based on channel information that is obtained by processing the signal transmitted through the communication channel.

According to an exemplary embodiment of the inventive concept, a method of communicating with a memory device via a memory interface is provided. The method includes generating first data to be stored in the memory device; generating second data by converting the first data; and writing the second data to the memory device, where the generating of the second data includes generating the second data having a size less than a size of the first data to reduce power consumption in at least one of the memory device or the memory interface.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Figure 1:
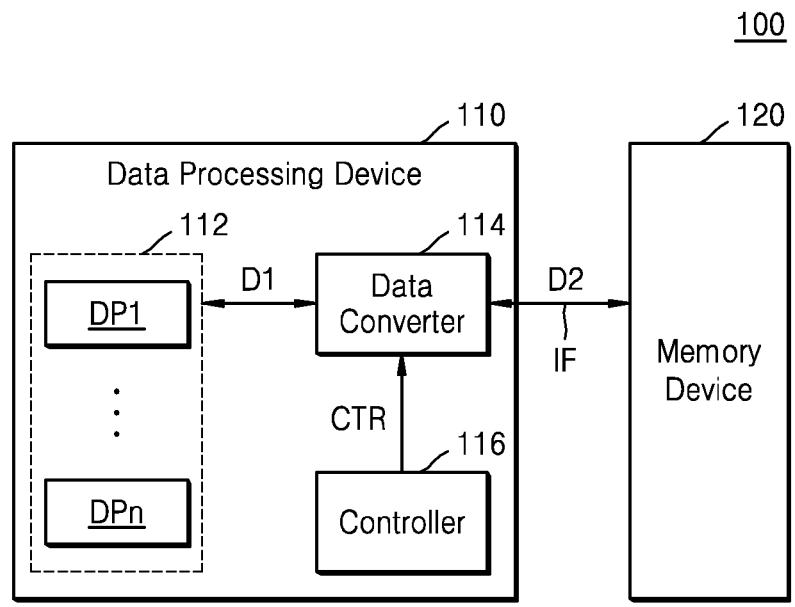
FIG. 1 is a diagram of a system including a data processing device according to an exemplary embodiment of the inventive concept.

FIG. 1 is a block diagram of a system 100 including a data processing device 110 according to an exemplary embodiment of the inventive concept. As shown in FIG. 1, the system 100 includes the data processing device 110 and a memory device 120 communicating with each other via a memory interface IF. In an exemplary embodiment, the data processing device 110 and any other below discussed data processing device may be implemented by a modem. However, the data processing devices are not limited thereto, and could be implemented by various other devices.

The system 100 may denote an arbitrary apparatus including the data processing device 110 and the memory device 120. In some embodiments, the system 100 includes a computing system that may be a portable computing system including a laptop computer, a tablet computer, a smartphone, a wearable device, a portable media player (PMP), etc., or a stationary computing system such as a desktop computer, a server, an electronic appliance, etc. In some embodiments, the system 100 may include a component of the above-described computing systems, a vehicle control system, an industrial control system, etc., and may include a module including a board, on which the data processing device 110 and the memory device 120 are mounted.

In some embodiments, the data processing device 110 and the memory device 120 may include semiconductor chips manufactured through semiconductor processes. The data processing device 110 and the memory device 120 may be included in one semiconductor package according to some embodiments, or may be mounted on a printed circuit board as independent packages in some other embodiments. The data processing device 110 may include, as non-limiting examples, an application processor (AP), an application specific integrated circuit (ASIC), an application specific instruction set processor (ASIP), a field programmable gate array (FPGA), etc. The memory device 120 may include, as non-limiting examples, a non-volatile memory such as electrically erasable programmable read-only memory (EEPROM), flash memory, phase change RAM (PRAM), resistance RAM (RRAM), nano floating gate memory (NFGM), polymer RAM (PoRAM), magnetic RAM (MRAM), ferroelectric RAM (FRAM), etc. or a volatile memory such as dynamic RAM (DRAM), static RAM (SRAM), mobile DRAM, double data rate synchronous DRAM (DDR SDRAM), low power DDR (LPDDR) SDRAM, graphic DDR (GDDR) SDRAM, rambus DRAM (RDRAM), etc.

The data processing device 110 and the memory device 120 may communicate with each other via the memory interface IF. The data processing device 110 may provide the memory device 120 with commands such as write a command, a read command, etc., and addresses via the memory interface IF. Also, the data processing device 110 may provide data with the write command to the memory device 120 and may receive data from the memory device 120 in response to the read command. As shown in FIG. 1, data provided to the memory device 120 and received from the memory device 120 by the data processing device 110 via the memory interface IF may be referred to as second data D2. Hereinafter, one or more embodiments of the inventive concept will be described mainly based on an operation of writing the second data D2 to the memory device 120, where the operation of writing is performed by the data processing device 110.

The memory interface IF is a non-limiting example, and may denote a bus protocol for communication such as double data rate type two synchronous DRAM (DDR2), double data rate fourth generation synchronous DRAM (DDR4), graphics double data rate (GDDR), etc., and may define at least one channel. In some embodiments, the memory interface IF may define independent channels for commands, addresses, and data, or may define a channel shared by two or more among of the commands, the addresses, and the data. The channel may include at least one signal line, and the command, the address, and the data may be moved as electrical signals via at least one signal line. As the amount of data to be processed in the system 100 increases, the amount of data processed in the data processing device 110 may increase. Accordingly, the data processing device 110 may communicate more frequently with the memory device 120 via the memory interface IF in order to write and/or read data, and electric power consumed by the memory device 120 and the memory interface IF may increase. The electric power consumed by the memory device 120 and the memory interface IF increases faster than the electric power consumed by the data processing device 110 according to an increase in the data processing speed and the amount of data. Hereinafter, as described below with reference to accompanying drawings, the data processing device 110 according to at least one embodiment of the inventive concept may reduce the electric power consumed by the memory device 120 and the memory interface IF by reducing a size of the second data D2 moving through the memory interface IF. Reducing the power consumption in the memory device 120 and the memory interface IF by reducing the size of the second data D2 may be simply referred to as a reduction in the power consumption by the memory interface IF.

Referring to FIG. 1, the data processing device 110 includes data processors 112, a data converter 114 (e.g., a data converting circuit), and a controller 116 (e.g., a control circuit). The data processors 112 generate first data D1 to be stored in the memory device 120 and provide the first data D1 to the data converter 114. The data processors 112 may include first to n-th data processors DP1 to DPn (n is 1 or a greater integer). In some embodiments, the data processing device 110 includes only one data processor, unlike the example shown in FIG. 1.

Each of the first to n-th data processors DP1 to DPn may denote an arbitrary processor generating the first data D1. For example, each of the first to n-th data processors DP1 to DPn may include, for example, a core such as a central processing unit (CPU), a digital signal processor (DSP), a graphics processing unit (GPU), etc. executing instructions, or may include an intellectual property exclusive for hardware, e.g., a hardware accelerator, etc. Each of the first to n-th data processors DP1 to DPn may generate the first data D1 as input data that is a processing target, intermediate data generated by processing the input data, and result data. As described above, as the data processing amount and processing speed of the data processing device 110 increase, a size of the first data D1 provided to the data converter 114 may increase.

The data converter 114 receives the first data D1 from the data processors 112 and generates second data D2 by converting the first data D1 according to a control signal CTR transmitted from the controller 116. As described below with reference to FIG. 2, the data converter 114 may generate the second data D2 that is the same as the first data D1 or the second data D2 having a size smaller than that of the first data D1, according to the control signal CTR. The data converter 114 may convert the first data D1 in an arbitrary way in order to generate the second data D2 having a smaller size than that of the first data D1. For example, the data converter 114 may generate the second data D2 by compressing the first data D1 by using, e.g., lossless compression and/or lossy compression, or may generate the second data D2 by using a method of reducing a bit width of the first data D1 such as bit saturation, in which upper bits of the first data D1 are removed, and bit clipping, in which lower bits of the first data D1 are removed, a data mapping method, data puncturing, etc. In some embodiments, the data converter 114 supports a plurality of conversion methods and generates the second data D2 from the first data D1 by one conversion method selected according to the control signal CTR.

The controller 116 determines the size of the second data D2 and provides the control signal CTR to the data converter 114 based on the determined size of the second data D2. In some embodiments, the size of the second data D2 determined by the controller 116 denotes a ratio of the second data D2 with respect to the first data D1. In some embodiments, the size of the second data D2 determined by the controller 116 denotes a maximum size of the second data D2.

The controller 116 may determine the size of the second data D2 based on various factors and may control the data converter 114, so that the second data D2 having the determined size is generated and provided to the memory device 120 via the memory interface IF. In some embodiments, the controller 116 generates the control signal CTR so that the second data D2 has the size less than that of the first data D1 in order to reduce the power consumption of the memory device 120 and the memory interface IF. For example, the controller 116 may recognize that the system 100 is in a special state where normal operation of the data processing device 110 is unaffected even when some information included in the first data D1 is removed. When this state is recognized, the controller 116 may generate the control signal CTR that allows the data converter 114 to remove some information included in the first data D1 and to generate the second data D2, based on the recognized state. Also, in some embodiments, the controller 116 generates the control signal CTR, so as to generate the second data D2 that is equal to the first data D1 in order to improve the performance of the data processing device 110 (or the system 100). For example, generating the second data D2 that is equal to the first D1 may be performed much more quickly than removing some information included in the first data D1 to generate the second data D2 or compressing the first data D1 to generate the second D2. For example, rather than operating logic to perform the removal or the compression, the first data D1 can merely be passed through the data converter 114 without performing any operation. Thus, the data converter 114 can be immediately ready to perform the next data conversion. An example of the operation of the controller 116 will be described later with reference to FIG. 2. Each of the data converter 114 and the controller 116 may include a logic block (e.g., a logic circuit) that is designed by logic synthesis and/or may include a software block including instructions and a processor executing the software block.

Figure 2:
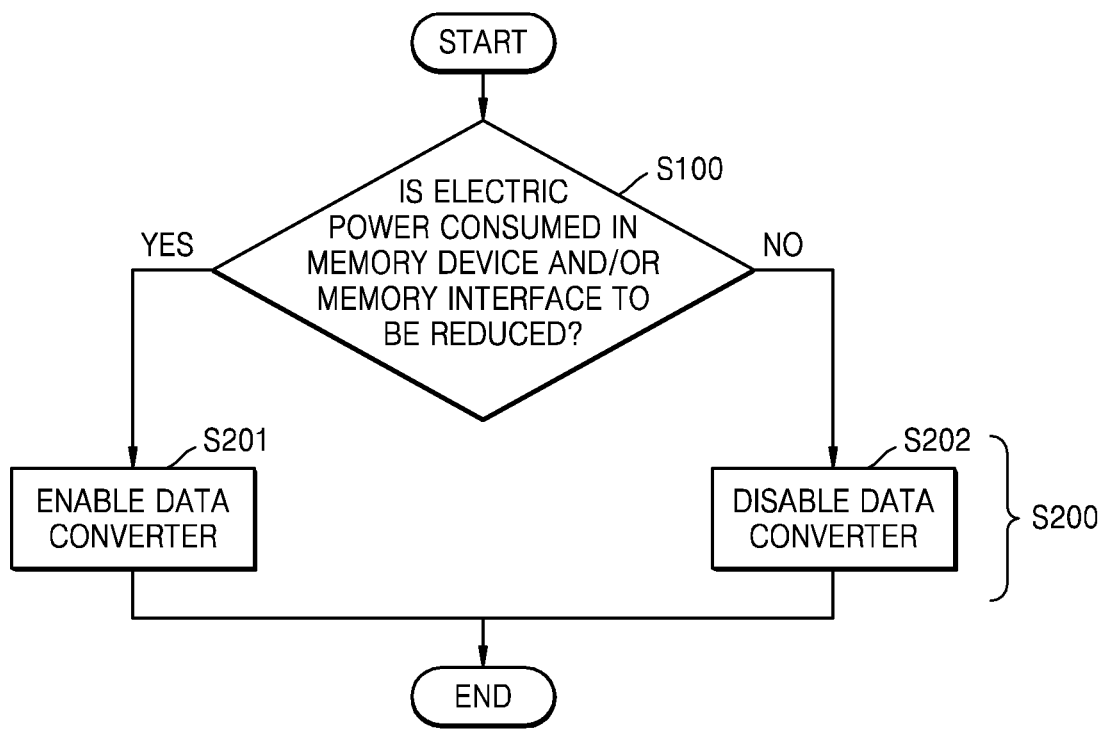
FIG. 2 is a flowchart illustrating a method of communicating with a memory device according to an exemplary embodiment of the inventive concept.

FIG. 2 is a flowchart illustrating a method of communicating with the memory device 120 according to an exemplary embodiment of the inventive concept. For example, the method illustrated in FIG. 2 may be performed by the controller 116 of FIG. 1. Hereinafter, FIG. 2 will be described with reference to FIG. 1.

Referring to FIG. 2, in operation S100, an operation of determining whether to reduce electric power consumed by the memory device 120 and/or the memory interface IF is performed. In some embodiments, the controller 116 may determine whether to reduce the electric power consumed by the memory device 120 and the memory interface IF based on internal information obtained in the system 100. In some embodiments, the controller 116 may determine whether to reduce the electric power consumed by the memory device 120 and the memory interface IF based on external information extracted from a signal transmitted from outside the system 100. Also, in some embodiments, the controller 116 may determine whether to reduce the electric power consumed by at least one of the memory device 120 and the memory interface IF based on both the internal and external information.

In operation S200 following operation S100, an operation of controlling the data converter 114 is performed. As shown in FIG. 2, operation S200 may include operation S201 and operation S202, and when it is determined that the electric power consumed by the memory interface IF is to be reduced in operation S100, operation S201 is performed; otherwise, operation S202 is performed.

In operation S201, an operation of enabling the data converter 114 is performed. For example, the controller 116 may enable the data converter 114 to generate the second data D2 having a size less than that of the first data D1. The enabled data converter 114 may correspond to a state in which the second data D2 having the size less than that of the first data D1 is generated. In some embodiments, the data converter 114 supports a plurality of conversion methods. The controller 116 may enable the data converter 114, and at the same time, may indicate one of the plurality of conversion methods.

In operation S202, an operation of disabling the data converter 114 is performed. For example, the controller 116 may disable the data converter 114 to generate the second data D2 that is the same as the first data D1. The data converter 114 that is disabled may correspond to a state in which the second data D2 that is the same as the first data D1 is generated. For example, the data converter 114 that is disabled in response to the control signal CTR may output the second data D2 by bypassing operating on the first data D1.

Figures 3, 4:
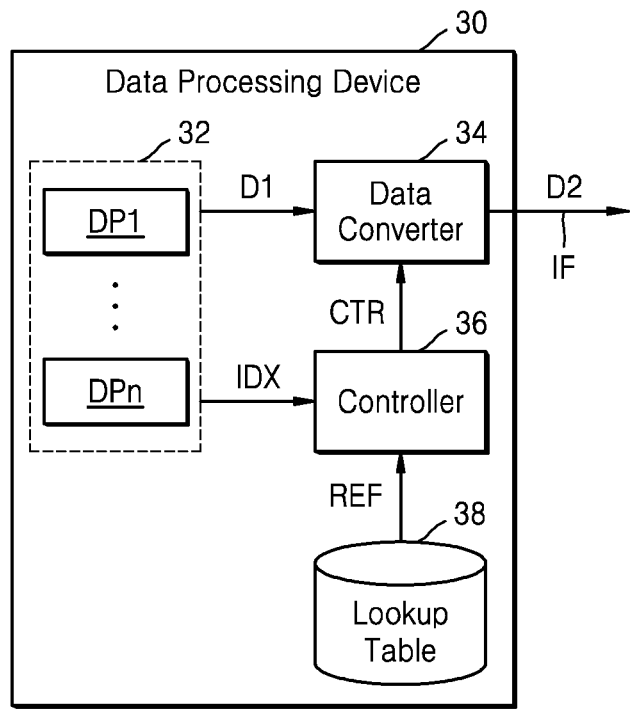
FIG. 3 is a diagram of a data processing device according to an exemplary embodiment of the inventive concept.
FIG. 4 is a diagram showing an example of a lookup table of FIG. 3, according to an exemplary embodiment of the inventive concept.

FIG. 3 is a block diagram of a data processing device 30 according to an exemplary embodiment of the inventive concept. In detail, as compared with the data processing device 110 of FIG. 1, the data processing device 30 of FIG. 3 further includes a lookup table 38. For example, the data processing device 110 may be replaced with the data processing device 30. Hereinafter, FIG. 3 will be described with reference to FIG. 1, and descriptions already provided above with reference to FIG. 1 will be omitted.

Referring to FIG. 3, the data processing device 30 includes data processors 32, a data converter 34 (e.g., a data converting circuit), a controller 36 (e.g., a control circuit), and a lookup table 38. The data processors 32 include first to n-th data processors DP1 to DPn (n is 1 or a greater integer) and provide first data D1 to the data converter 34. For example, the first to n-th data processors DP1 to DPn may share a bus and may provide the first data D1 to be stored in the memory device 120 to the data converter 34 via the bus.

In an exemplary embodiment, the data processors 32 may provide index data IDX to the controller 36. The index data IDX identifies the data processor that is currently providing the first data D1 to the data converter 34, from among the first to n-th data processors DP1 to DPn. For example, the index data IDX may include an index ranging from 1 to n.

Also, in some embodiments, two or more of the data processors 32 simultaneously provide the first data D1 to the data converter 34. For example, the first data processor DP1 and the n-th data processor DPn may provide the first data D1 to the data converter 34 in a time-sharing manner, and in this case, the index data IDX includes an index '1' indicating the first data processor DP1 and an index 'n' indicating the n-th data processor DPn.

The lookup table 38 may provide reference data REF to the controller 36. In an embodiment, an arbitrary memory device, e.g., a non-volatile memory device, stores the lookup table 38, and the lookup table 38 stores the reference data REF. The reference data REF may include information that is necessary for the controller 36 to control the data converter 34, that is, information that is necessary for determining whether to reduce the power consumption of the memory interface IF. The reference data REF may be written to the lookup table 38 during one or more processes of manufacturing the data processing device 30, in some embodiments. Examples of the lookup table 38 and the reference data REF will be described later with reference to FIG. 4.

The controller 36 may receive the index data IDX from the data processors 32 and may receive the reference data REF from the lookup table 38. In an exemplary embodiment, the controller 36 generates the control signal CTR based on the received index data IDX and the received reference data REF. In an exemplary embodiment of the inventive concept, the controller 36 identifies at least one data processor, from among the data processors 32, generating the first data D1 based on the index data IDX and estimates the electric power consumed by the memory device 120 and the memory interface IF based on the first data D1 generated by the at least one identified data processor. Also, as described later with reference to FIG. 4, the controller 36 may estimate the electric power consumed by the memory device 120 and the memory interface IF based on the reference data REF provided from the lookup table 38. The controller 36 may determine whether to reduce the power consumption of the memory device 120 and the memory interface IF, that is, whether to enable the data converter 34, based on the estimated electric power. For example, the controller 36 may compare the estimated electric power with at least one reference value defined in advance, and when a condition defined in advance is satisfied, that is, when the estimated electric power is greater than the reference value, the controller 36 may output the control signal CTR for reducing the power consumption of the memory device 120 and the memory interface IF.

FIG. 4 is a diagram showing an example of the lookup table 38 of FIG. 3, according to an exemplary embodiment of the inventive concept. As described above with reference to FIG. 3, a lookup table 38' of FIG. 4 may store the reference data REF, and the controller 36 of FIG. 3 may estimate the electric power consumed by the memory device 120 and the memory interface IF based on the reference data REF. The data included in the lookup table 38' of FIG. 4 is an example, and the lookup table 38 of FIG. 3 may include only some of the data shown in FIG. 4 in some embodiments or may include additional data that is not shown in FIG. 4 in some other embodiments. Hereinafter, FIG. 4 will be described with reference to FIG. 3.

In some embodiments, the lookup table 38' may include the amount of electric power (e.g., a number of Watts) consumed by the memory device and/or the memory interface IF as an entry. For example, as shown in FIG. 4, the lookup table 38' may include a plurality of entries (e.g., $P_{10}$, $P_{n3}$, etc.), and each of the plurality of entries may correspond to the electric power consumed by the memory device and/or the memory interface IF under a condition of a corresponding row and column in the lookup table 38'. The controller 36 may receive reference data REF including the entry corresponding to a current condition from the lookup table 38' and may estimate the electric power consumed by the memory device and/or the memory interface IF based on the reference data REF.

In some embodiments, the lookup table 38' may store electric power information corresponding to each of the data processors 32. For example, in the lookup table 38' of FIG. 4, one row may correspond to one data processor, and the lookup table 38' may include $P_{10}$, $P_{11}$, $P_{12}$, and $P_{13}$ as electric power information regarding the first data processor DP1. The controller 36 may identify the data processor that is currently generating the first data D1 from the index data IDX transmitted from the data processors 32 and may estimate the electric power consumed by the memory device and/or the memory interface IF by obtaining the electric power information corresponding to the data processor.

In some embodiments, the lookup table 38' may include information about the electric power (may be referred to as first electric power) consumed by the memory device and/or the memory interface IF by the second data D2 that is equal to the first data D1. In other words, the lookup table 38' may include information about the electric power consumed by the memory device and/or the memory interface IF in a state where the data converter 34 is disabled. As shown in FIG. 4, entries (e.g., $P_{10}$, $P_{n0}$, etc.) included in the second column of the lookup table 38' may correspond to electric power (may be referred to as pieces of first electric power in the specification) consumed by the memory device and/or the memory interface IF according to the first to n-th data processors DP1 to DPn, in a state where the data converter 34 is disabled. For example, when the first data processor DP1 generates the first data D1 and the second data D2 that is the same as the first data D1 written to the memory device (120 of FIG. 1) via the memory interface IF, the electric power consumed by the memory device and/or the memory interface IF may correspond to $P_{10}$. The controller 36 may estimate the electric power consumed by the memory device and/or the memory interface IF in a state where the data converter 34 is disabled, based on the entries included in the second column of the lookup table 38'.

In some embodiments, the lookup table 38' may include information about the electric power (may be referred to as first electric power) consumed by the memory device and/or the memory interface IF by the second data D2 having a size less than that of the first data D1. In other words, the lookup table 38' may include information about the electric power consumed by the memory device and/or the memory interface IF in a state where the data converter 34 is enabled. As shown in FIG. 4, entries (e.g., $P_{11}$, $P_{n3}$, etc.) included in third to fifth columns of the lookup table 38' may correspond to electric power consumed by the memory device and/or the memory interface IF according to the first to n-th data processors DP1 to DPn, in a state where the data converter 34 is enabled.

As described above with reference to FIG. 1, the data converter 34 may support a plurality of conversion methods, and accordingly, the lookup table 38' may include information about electric power (may be referred to as a plurality pieces of second electric power) corresponding to the plurality of conversion methods. For example, when the first data processor DP1 generates the first data D1 and the data converter 34 generates the second data D2 by converting the first data D1 using a first conversion method, the electric power consumed by the memory device and/or the memory interface IF may correspond to $P_{11}$. Although the lookup table 38' of FIG. 4 is shown to include entries corresponding to three different conversion methods, the lookup table 38' may include entries corresponding to conversion methods less than three or greater than three, according to the conversion methods supported by the data converter 34.

Figure 5:
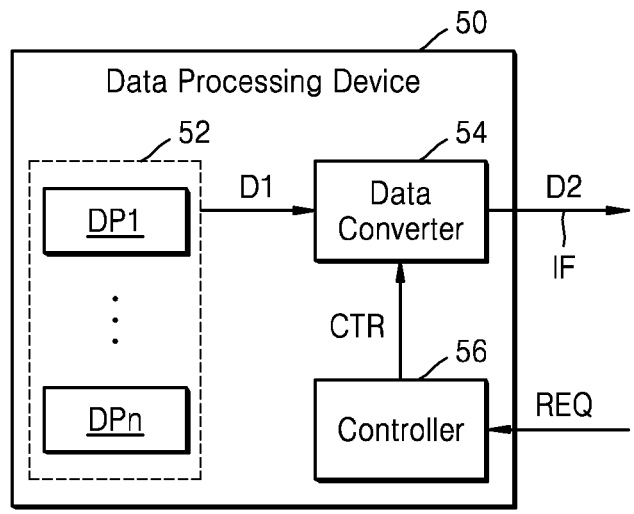
FIG. 5 is a diagram of a data processing device according to an exemplary embodiment of the inventive concept.
Figure 6:
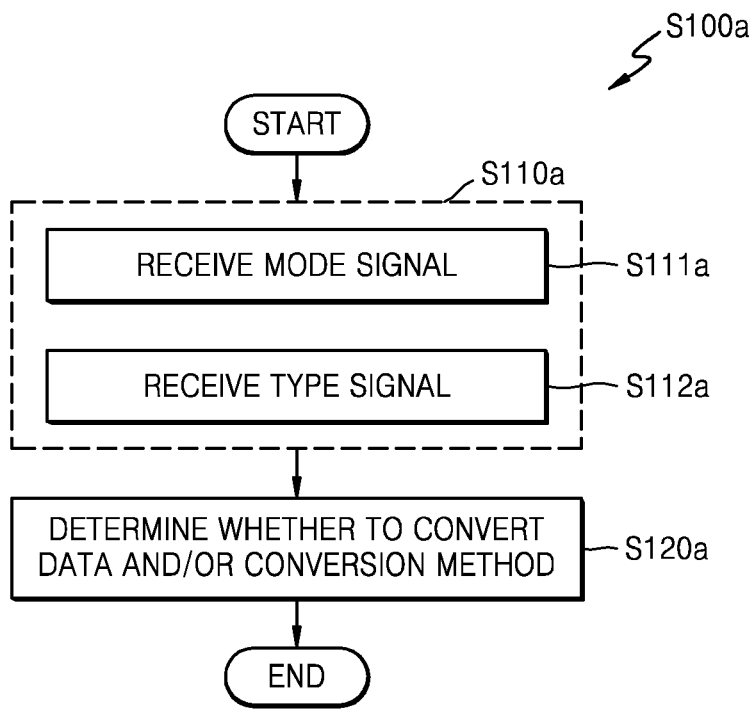
FIG. 6 is a diagram showing an example of operation S100 of FIG. 2, according to an exemplary embodiment of the inventive concept.

FIG. 5 is a block diagram of a data processing device 50 according to an exemplary embodiment of the inventive concept, and FIG. 6 is a flowchart illustrating an example of operation S100 of FIG. 2, according to an exemplary embodiment. In detail, FIG. 5 shows the data processing device 50 further including a controller 56 receiving a power request REQ, compared to the data processing device 110 of FIG. 1, and operation S100a of FIG. 6 may be performed by the controller 56 of FIG. 5. The data processing device 110 may be replaced with the data processing device 50. Hereinafter, FIGS. 5 and 6 will be described with reference to FIG. 1, and descriptions already provided above with reference to FIG. 1 will be omitted.

Referring to FIG. 5, the data processing device 50 includes data processors 52, a data converter 54 (e.g., a data converting circuit), and the controller 56 (e.g., a control circuit). The data processors 52 may include first to n-th data processors DP1 to DPn (n is 1 or a greater integer) and may provide first data D1 to the data converter 54.

In an exemplary embodiment, the controller 56 generates the control signal CTR for controlling the data converter 54 based on the power request REQ. The power request REQ is a request for the power consumption of the data processing device 50, and may be transmitted from outside the data processing device 50. In some embodiments, the power request REQ may be transmitted from outside the system (100 of FIG. 1) including the data processing device 50. Examples of the power request REQ will be described later with reference to FIG. 6. The controller 56 may generate the control signal CTR based on the power request REQ, and in some embodiments, may generate the control signal CTR based on the estimated power consumption of the memory device 120 and/or the memory interface IF, as well as based on the power request REQ.

Referring to FIG. 6, operation S100a includes operation S110a and operation S120a. As described above with reference to FIG. 2, an operation of determining whether to reduce the electric power consumed by the memory interface IF is performed in operation S100a.

In operation S110a, an operation of receiving the power request REQ from outside the data processing device 50 may be performed. For example, the system 100 of FIG. 1 may include a main controller that controls the system 100, as well as the data processing device 110 and the memory device 120, and the data processing device 110 may receive the power request REQ from the main controller. As shown in FIG. 6, operation S110a includes operation S111a and operation S112a, and in some embodiments, operation S110a includes only one of operation S111a and operation S112a.

In operation S111a, an operation of receiving a mode signal may be performed. For example, the data processing device 50 may receive an external mode signal as the power request REQ. In an exemplary embodiment, the mode signal includes mode information indicating a power mode of the data processing device 50. The data processing device 50 enters a normal mode or a low-power mode in response to the mode signal. As described above with reference to FIG. 1 and so on, the electric power consumed by the memory interface IF and the memory device 120 may be largely increased in the system 100, and accordingly, the controller 56 may adjust the electric power consumed by the memory device 120 and/or the memory interface IF based on the power mode of the data processing device 50 by controlling the data converter 54.

In operation S112a, an operation of receiving a type signal may be performed. In an exemplary embodiment, the type signal indicates one of the plurality of conversion methods performed by the data converter 54. In an embodiment, an element outside the data processing device 50, for example, the main controller, defines conditions about the electric power consumed by the memory device 120 and/or the memory interface IF, and may directly designate the conversion method that is used to generate the second data D2 from the first data D1 according to the defined conditions. Accordingly, the controller 56 may adjust the electric power consumed by the memory device 120 and/or the memory interface IF by controlling the data converter 54 according to the type signal.

In operation S120a, an operation of determining whether to convert data and/or determining the conversion method may be performed. For example, the controller 56 may determine whether to convert data (that is, whether to enable the data converter 54) and/or the conversion method, based on the mode signal and/or the type signal received in operation S110a as the power request REQ. In some embodiments, when the mode signal corresponds to the low-power mode, the controller 56 may enable the data converter 54, and accordingly, the second data D2 having a size less than that of the first data D1 may be generated. On the other hand, when the mode signal corresponds to the normal mode, the controller 56 may disable the data converter 54, and accordingly, the second data D2 that is the same as the first data D1 may be generated. Also, in some embodiments, the controller 56 may output the control signal CTR so that the first data D1 is converted into the second data D2 according to the conversion method indicated by the type signal.

In some embodiments, the controller 56 may determine whether to convert the data and/or the conversion method based on the power consumption of the memory device 120 and/or the memory interface IF, as well as the mode signal. For example, when the mode signal corresponds to the low-power mode, the controller 56 may estimate the power consumption of the memory device 120 and/or the memory interface IF, and when the estimated power consumption is lower than a reference value defined in advance, the controller 56 may disable the data converter 54. Also, when the mode signal corresponds to the low-power mode, the controller 56 may determine one of the plurality of conversion methods according to a range, in which the estimated power consumption is included, and may control the data converter 54 to generate the second data D2 according to the determined conversion method. For example, when the estimated power consumption is relatively low, the controller 56 may select a conversion method, by which the size of data is relatively less reduced, from among the plurality of conversion methods.

Figure 7:
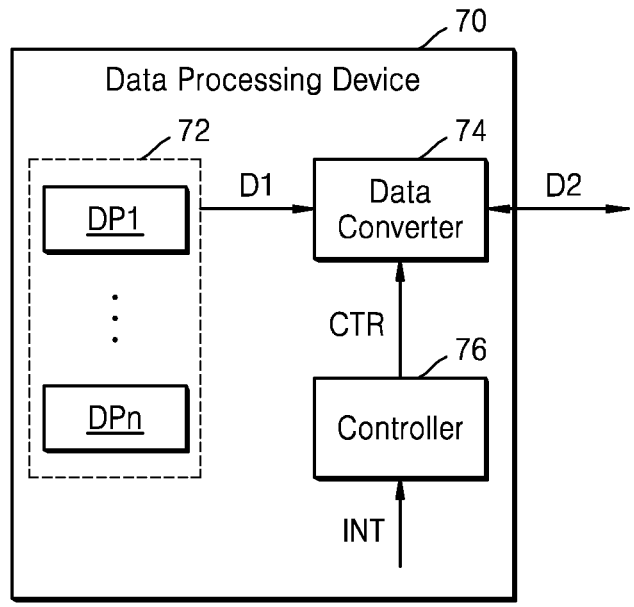
FIG. 7 is a diagram of a data processing device according to an exemplary embodiment of the inventive concept.
Figure 8:
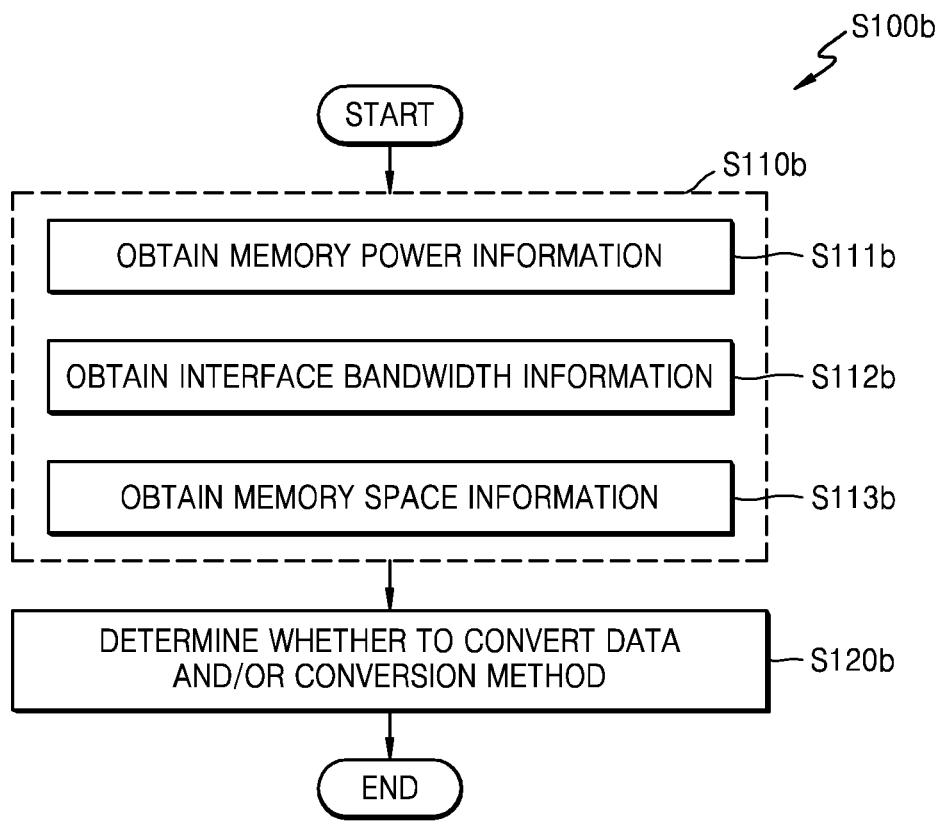
FIG. 8 is a diagram showing an example of operation S100 of FIG. 2, according to an exemplary embodiment of the inventive concept.

FIG. 7 is a block diagram of a data processing device 70 according to an exemplary embodiment of the inventive concept, and FIG. 8 is a flowchart illustrating an example of operation S100 of FIG. 2, according to an exemplary embodiment. In detail, FIG. 7 shows the data processing device 70 including a controller 76 obtaining internal information INT, compared to the data processing device 110 of FIG. 1, and operation S100b of FIG. 8 may be performed by the controller 76 of FIG. 7. The data processing device 110 may be replaced with the data processing device 70. Hereinafter, FIGS. 7 and 8 will be described with reference to FIG. 1, and descriptions already provided above with reference to FIG. 1 will be omitted.

Referring to FIG. 7, the data processing device 70 includes data processors 72, a data converter 74 (e.g., a data converting circuit), and the controller 76 (e.g., a control circuit). The data processors 72 may include first to n-th data processors DP1 to DPn (n is 1 or a greater integer) and may provide first data D1 to the data converter 74. In an embodiment, the controller 76 generates a control signal CTR for controlling the data converter 74, based on the internal information INT. The internal information INT may denote information generated in the system (e.g., 100 of FIG. 1) including the data processing device 70. In some embodiments, the internal information INT may be generated by the data processing device 70 from at least one signal transmitted from outside the data processing device 70. Examples of the internal information INT will be described later with reference to FIG. 8. The controller 76 may generate the control signal CTR based on the internal information INT, and in some embodiments, the control signal CTR may be generated based on the estimated power consumption of the memory interface IF, as well as the internal information INT.

Referring to FIG. 8, operation S100b includes operation S110b and operation S120b. As described above with reference to FIG. 2, in operation S110b, an operation of determining whether to reduce the electric power consumed by the memory device 120 and/or the memory interface IF is performed.

In operation S110b, an operation of obtaining the internal information INT is performed. The internal information INT may denote arbitrary information related to electric power, and is generated in the system (e.g., 100 of FIG. 1) including the data processing device 70. In some embodiments, the controller 76 may receive the internal information INT and may generate the internal information INT based on at least one parameter. As shown in FIG. 8, operation S110b may include operation S111b, operation S112b, and operation S113b, and in some embodiments, operation S110b may include only some of operation S111b, operation S112b, and operation S113b.

In operation S111b, an operation of obtaining memory power information is performed. The memory power information may be obtained by measuring the electric power consumed by the memory device 120 and/or the memory interface IF, and the controller 76 may identify the electric power consumed by the memory device 120 and/or the memory interface IF from the memory power information. Compared to the controller 36 of FIG. 3, which uses the estimated power consumption of the memory device 120 and/or the memory interface IF, the controller 76 of FIG. 7 may use the measured power consumption of the memory device 120 and/or the memory interface IF. Accordingly, the estimated power consumption of the memory device 120 and/or the memory interface IF in the above-described examples with reference to accompanying drawings may be replaced with the measured power consumption of the memory device 120 and/or the memory interface IF in some embodiments.

In operation S112b, an operation of obtaining information about interface bandwidth may be performed. The interface bandwidth information may denote an available bandwidth of the memory interface IF, and the controller 76 may identify the available bandwidth of the memory interface IF from the interface bandwidth information. For example, the available bandwidth of the memory interface IF may be dependent upon an internal state of the memory device 120, or may be dependent upon another device accessing the memory device 120. The controller 76 may obtain available bandwidth information from the memory device 120 in some embodiments, or from the main controller in some other embodiments. Alternately, when the memory device 120 is solely accessed by the data processing device 70 in some embodiments, the controller 76 may calculate the available bandwidth by itself.

In operation S113b, an operation of obtaining memory space information may be performed. The memory space information may denote available space of the memory device 120, and the controller 76 may identify the available space of the memory device 120 based on the memory space information. The controller 76 may obtain memory space information from the memory device 120 in some embodiments, or from the main controller in some other embodiments. Alternatively, when the memory device 120 is solely accessed by the data processing device 70 in some embodiments, the controller 76 may calculate the available space of the memory device 120 by itself.

In operation S120b, an operation of determining whether to convert data and/or determining the conversion method may be performed. For example, the controller 76 may determine whether to convert the data (that is, whether to enable the data converter 74) and/or the conversion method based on at least one of the memory power information, the interface bandwidth information, and the memory space information obtained in operation S110b as the internal information INT. In some embodiments, based on the memory power information, the controller 76 may enable the data converter 74 when the power consumption of the memory device 120 and/or the memory interface IF is greater than a reference value defined in advance and may disable the data converter 74 when the power consumption of the memory device 120 and/or the memory interface IF is less than the reference value defined in advance. In some embodiments, based on the interface bandwidth information, the controller 76 may enable the data converter 74 when the available bandwidth of the memory interface IF is less than a reference value defined in advance, and may disable the data converter 74 when the available bandwidth of the memory interface IF is greater than the reference value defined in advance. In some embodiments, based on the memory space information, the controller 76 may enable the data converter 74 when the available space of the memory device 120 is less than a reference value defined in advance and may disable the data converter 74 when the available space of the memory device 120 is greater than the reference value defined in advance. Also, in some embodiments, the above conditions may be combined to be evaluated, for example, the controller 76 may enable or disable the data converter 74 when two or more of the above-described conditions are satisfied.

In some embodiments, when enabling the data converter 74, the controller 76 may determine one of the plurality of conversion methods according to a range in which values indicated by the pieces of information obtained in operation S110b are included. For example, when one of the power consumption of the memory device 120 and/or the memory interface IF obtained from the memory power information, the available bandwidth of the memory interface IF obtained from the interface bandwidth information, and the available space of the memory device 120 obtained from the memory space information is included in one of a plurality of ranges defined in advance, the controller 76 may determine the conversion method corresponding to the corresponding range.

Figure 9:
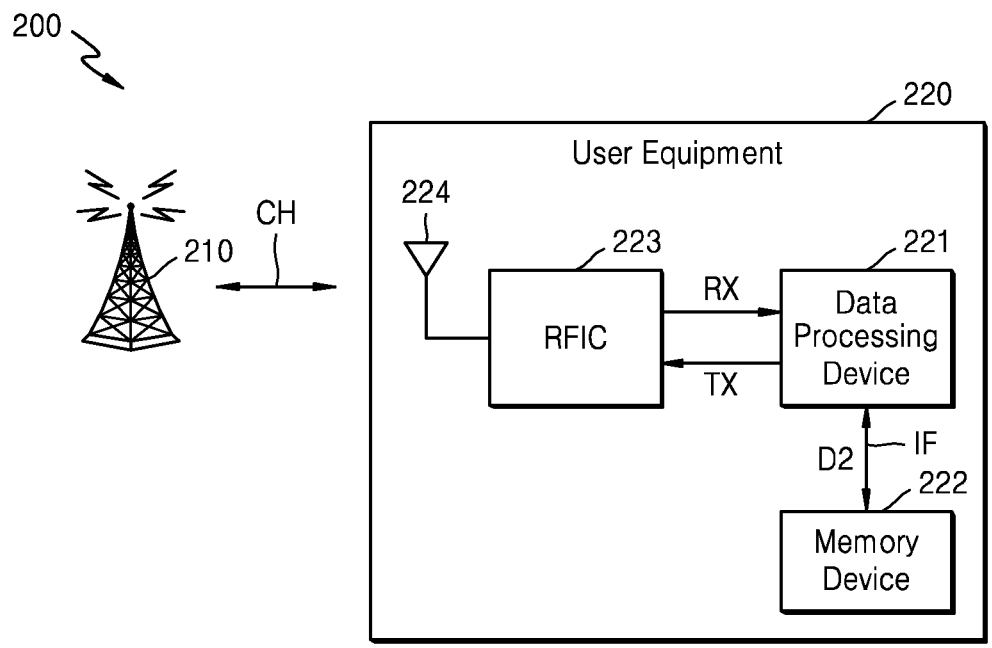
FIG. 9 is a diagram of a user equipment including a data processing device according to an embodiment and a wireless communication system including the user equipment.

FIG. 9 is a block diagram of user equipment 220 including a data processing device 221 according to an exemplary embodiment and a wireless communication system 200 including the user equipment 220. As described later, the data processing device 221 according to the exemplary embodiment may be used to process signals transmitted/received through a communication channel CH and may dynamically adjust the power consumed by a memory device 222 and/or the memory interface IF.

The wireless communication system 200 may include, as non-limiting examples, a wireless communication system using a cellular network, e.g., a 5th generation wireless (5G) system, a long term evolution (LTE) system, an LTE-Advanced system, a code division multiple access (CDMA) system, a global system for mobile communication (GSM), etc., a wireless local area network (WLAN) system, or another arbitrary wireless communication system. Hereinafter, the wireless communication system 200 will be described based on a wireless communication system using a cellular network, but the inventive concept is not limited thereto. As shown in FIG. 9, in the wireless communication system 200, wireless communication devices such as the user equipment 220 and the base station 210 communicate with each other, and each of the wireless communication devices may include a data processing device 221 according to an embodiment. In other words, although FIG. 9 shows that only the user equipment 220 includes the data processing device 221, a base station 210 may also include a data processing device that is the same as or similar to the data processing device 221.

The base station 210 may denote a fixed station communicating with the user equipment 220 and/or other base stations, and may exchange data and control information by communicating with the user equipment 220 and/or other base stations. The user equipment 220 may denote arbitrary equipment that is stationary or moveable and may transmit/receive data and/or control information by communicating with the base station 210.

A wireless communication network between the user equipment 220 and the base station 210 may share available network resources to support a plurality of users to communicate with one another. For example, in the wireless communication network, information may be transferred through various multiple access communication methods, e.g., CDMA, frequency division multiple access (FDMA), time division multiple access (TDMA), orthogonal frequency division multiple access (OFDMA), single carrier (SC)-FDMA, OFDM-FDMA, OFDM-TDMA, OFDM-CDMA, etc. As shown in FIG. 9, the user equipment 220 and the base station 210 may communicate with each other through the communication channel CH. Also, in some embodiments, the user equipment 220 may communicate with another equipment via a sidelink such as Device-to-Device (2D).

The user equipment 220 includes an antenna 224, a radio frequency integrated circuit (RFIC) 223, the data processing device 221, and the memory device 222. The antenna 224 may receive signals from the base station 210 via the communication channel CH or transmit signals to the base station 210 via the communication channel CH. The RFIC 223 may process RF band signals and baseband signals between the antenna 224 and the data processing device 221. For example, the RFIC 223 may include a filter, a low-noise amplifier, a power amplifier, a mixer, etc., may generate a received signal RX from an RF signal transmitted through the antenna 224, and may generate an RF signal from a transmission signal TX transmitted from the data processing device 221. In some embodiments, the RFIC 223 may be referred to as a transceiver.

The data processing device 221 may communicate with the memory device 222 via the memory interface IF and may write second data D2 to the memory device 222 or read the second data D2 from the memory device 222. In some embodiments, the data processing device 221 may adjust power consumption of the memory device 222 and/or the memory interface IF based on channel information that is obtained by processing the signal received through the communication channel CH. For example, similarly to the data processing device 110 of FIG. 1, the data processing device 221 may include data processors that process the received signal RX or generate the transmission signal TX, a data converter that generates the second data D2 from the first data D1, and a controller that controls the data converter. The controller may determine whether to convert the data and/or the conversion method, based on the channel information related to the communication channel CH.

Figure 10:
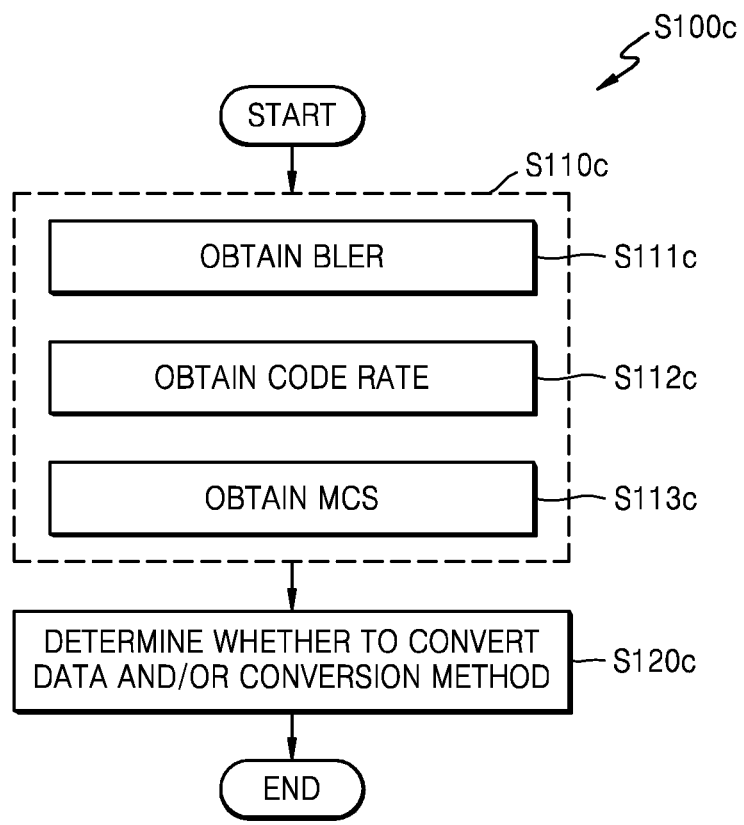
FIGS. 10 and 11 are diagrams showing examples of operation S100 of FIG. 2, according to an exemplary embodiment of the inventive concept.
Figure 11:
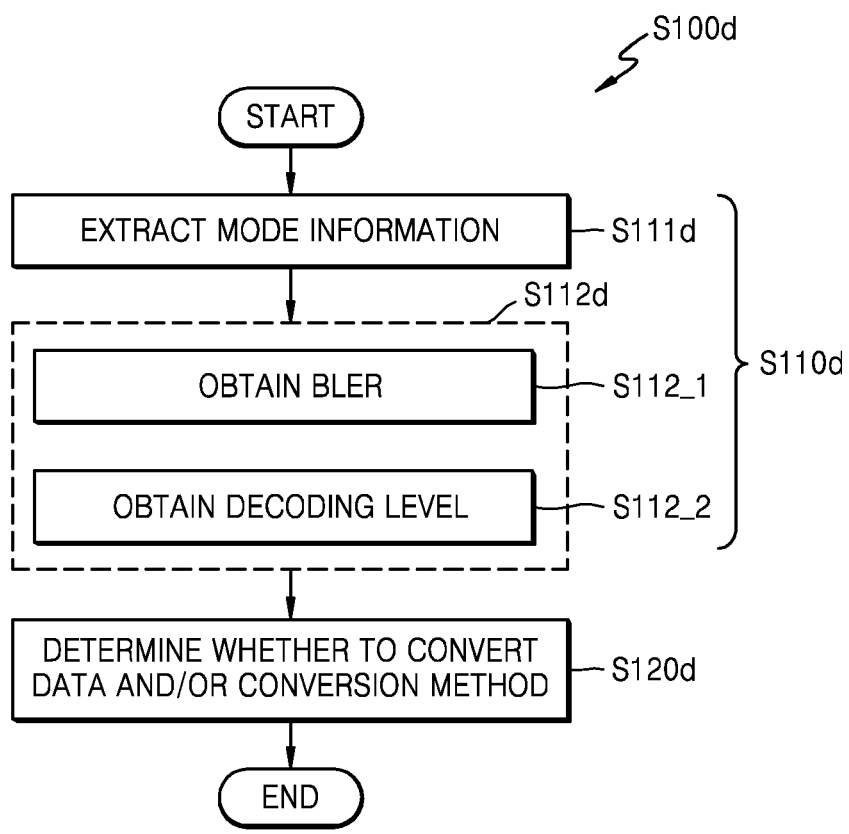

FIGS. 10 and 11 are flowcharts illustrating examples of operation S100 of FIG. 2 according to an exemplary embodiment of the inventive concept. In detail, FIG. 10 illustrates an example, in which the data processing device 221 of FIG. 9 uses information regarding a channel status in the channel information, and FIG. 11 illustrates an example, in which the data processing device 221 of FIG. 9 processes a direction (e.g., an instruction) transmitted from the base station 210 in the channel information. As described above with reference to FIG. 2, in operation S110c and operation S100d of FIG. 10 and FIG. 11, an operation of determining whether to reduce the electric power consumed by the memory device 222 and/or the memory interface IF may be performed. For example, operation S100c of FIG. 10 and operation S100d of FIG. 11 may be performed by the data processing device 221 of FIG. 9 or a controller included in the data processing device 221, like the controller 116 of FIG. 1. Hereinafter, it will be described that operations in FIGS. 10 and 11 are performed by the data processing device 221 with reference to FIG. 9, and overlapping descriptions will be omitted.

Referring to FIG. 10, operation S100c includes operation S110c and operation S120c. In operation S100c, an operation of obtaining channel information is performed. As described above with reference to FIG. 9, the channel information may denote information related to the communication channel CH, the information being generated from a signal transmitted through the communication channel CH to the base station 210. As shown in FIG. 10, operation S110c may include operation S111c, operation S112c, and operation S113c, and in some embodiments, may include only some of operations S111c, S112c, and S113c.

In operation S111c, an operation of obtaining a block error rate (BLER) may be performed. For example, the data processing device 221 may obtain the BLER as a decoding success rate generated when at least one data processor included in the data processing device 221 processes the received signal RX. A low BLER may denote that a relatively large amount of redundant information is included in the received signal RX due to an excellent state of the communication channel CH. Accordingly, BLER may be used as a factor for adjusting the power consumption in the memory device 222 and/or the memory interface IF in operation S120c.

In operation S112c, an operation of obtaining a code rate may be performed. For example, the data processing device 221 may obtain a code rate that is currently used by the communication channel CH. A low code rate may denote that data transmitted through the communication channel CH has high reliability, and thus the necessity of using the entire received data in decoding may be reduced. Accordingly, the code rate may be used as a factor of adjusting the power consumption in the memory device 222 and/or the memory interface IF in operation S120c.

In operation S113c, an operation of obtaining a modulation and coding scheme (MCS) may be performed. For example, the data processing device 221 may obtain an MCS that is currently used by the communication channel CH. A high MCS (or high MCS index) may denote that the communication channel CH has an excellent status, and necessity of using the entire received data in the decoding may be reduced due to the high reliability of the data received through the communication channel CH. Accordingly, the MCS may be used as a factor of adjusting the power consumption in the memory device 222 and/or the memory interface IF in operation S120c.

In operation S120c, an operation of determining whether to convert data and/or determining the conversion method may be performed. For example, the controller 76 may determine whether to convert the data (that is, whether to enable the data converter included in the data processing device 221) and/or the conversion method, based on at least one of the BLER, the code rate, and the MCS obtained in operation S110c as the channel information. For example, similarly to operation S120a of FIG. 6 and operation S120b of FIG. 8, the data processing device 221 may enable the data converter when the BLER is lower than a reference value defined in advance, when the code rate is lower than a reference value defined in advance, and when the MCS is higher than a reference value defined in advance, or may enable the data converter when two or more of the above conditions are satisfied. Also, the data processing device 221 may determine one of the plurality of conversion methods according to a range, in which the values obtained in operation S110c are included.

Referring to FIG. 11, operation S100d includes operation S110d and operation S120d. In operation S100d, an operation of receiving a direction from the base station 210 and obtaining necessary information in response to the direction may be performed. In some embodiments, the base station 210 may provide the user equipment 220 with a signal designating a power mode of the user equipment 220. For example, the base station 210 may provide a conditional direction, that is, may provide the user equipment 220 with a direction (e.g., an instruction) that the user equipment 220 may enter a normal mode or a low-power mode when a condition is satisfied. In response to the direction of the base station 210 with respect to the power mode, the user equipment 220 may determine whether to reduce the power consumption of the memory interface IF and/or the memory device 222. As shown in FIG. 11, operation S110d includes operation S111d and operation S112d.

In operation S111d, an operation of extracting mode information is performed. For example, the data processing device 221 may extract the mode information from a signal transmitted from the base station 210 via a control channel that is included in the communication channel CH. As described above, the base station 210 may designate the power mode of the user equipment 220, and the data processing device 221 may extract the mode information indicating the power mode.

In operation S112d, an operation of obtaining necessary information in response to the direction of the base station 210 may be performed. As shown in FIG. 11, operation S112d may include operation S112_1 and operation S112_2, and in some embodiments, may include only one of operation S112_1 and operation S112_2.

In operation S112_1, an operation of obtaining BLER is performed. As described above with reference to FIG. 10, the BLER may be used as a factor for adjusting the power consumption of the memory device 222 and/or the memory interface IF in operation S120d. In some embodiments, the base station 210 may identify the BLER of the user equipment 220 based on acknowledgment (ACK)/(negative ACK) NACK information, etc. provided by the user equipment 220, and may provide the user equipment 220 with the direction that the power consumption for the communication in the user equipment 220 may be reduced, when the BLER is less than a reference value defined in advance.

In operation S112_2, an operation of obtaining a decoding level may be performed. As described above with reference to FIG. 10, the decoding level may be used as a factor for adjusting the power consumption of the memory interface IF in operation S120d. In some embodiments, the mode information extracted in operation S111d may include the decoding level. For example, when it is determined that the communication channel CH has an excellent status based on proximity, etc. between the base station 210 and the user equipment 220, the base station 210 may provide the user equipment 220 with a direction that the decoding level of the data may be reduced in order to reduce the power consumption of the user equipment 220.

In operation S120d, an operation of determining whether to convert data and/or determining the conversion method may be performed. For example, based on the BLER and/or the decoding level obtained in operation S112d, the data processing device 221 may determine whether to convert the data (that is, whether to enable the data converter included in the data processing device 221) and/or the conversion method, similarly to operation S120c of FIG. 10.

The above-described embodiments may be combined with reference to accompanying drawings. For example, the above-described various information and/or directions that are used to determine whether to convert the data and/or the conversion methods may be combined to be used.

Figure 12:
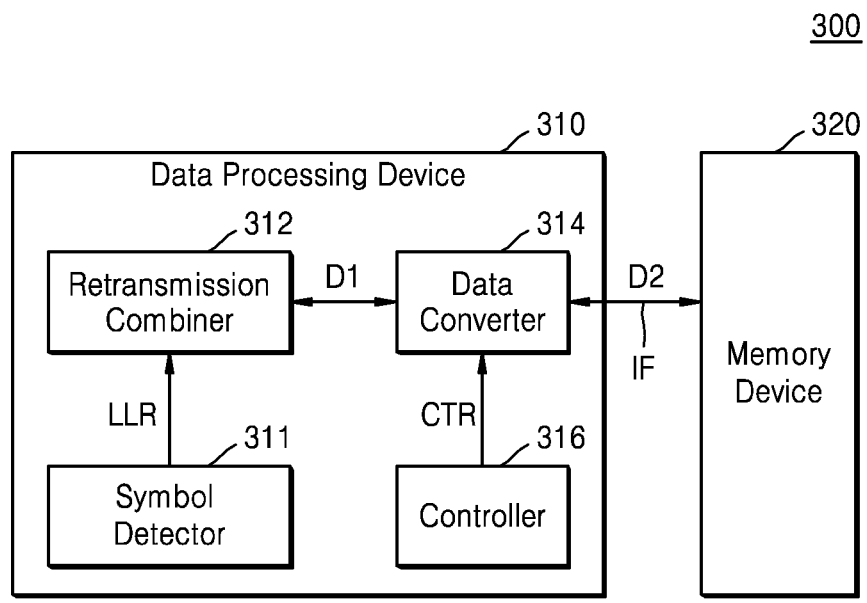
FIG. 12 is a diagram of a system including a data processing device according to an exemplary embodiment of the inventive concept.

FIG. 12 is a block diagram of a system 300 including a data processing device 310 according to an exemplary embodiment of the inventive concept. In detail, the system 300 of FIG. 12 may correspond to the user equipment 220 of FIG. 9 or a component included in the user equipment 220, and the data processing device 310 may process the signal received through the communication channel CH. When compared with the data processing device 110 of FIG. 1, the data processing device 310 of FIG. 12 includes a retransmission combiner 312 as a data processor. As shown in FIG. 12, the system 300 includes the data processing device 310 and a memory device 320 communicating with each other via the memory interface IF, and descriptions already provided above with reference to FIG. 1 will be omitted.

The data processing device 310 includes a symbol detector 311 (e.g., a logic circuit), a retransmission combiner 312 (e.g., a logic circuit), a data converter 314 (e.g., a data converting circuit), and a controller 316 (e.g., control circuit). The symbol detector 311 may detect a symbol included in a RF signal transmitted through the communication channel CH by processing the received signal RX of FIG. 9. In some embodiments, the symbol detector 311 provides a log likelihood ratio (LLR) generated in an initial transmission and retransmission to the retransmission combiner 312. In some embodiments, the symbol detector 311 may detect a symbol by performing channel and interference compensation, and may generate the LLR by converting the detected symbol into a value that is decodable.

The retransmission combiner 312 may process a retransmission such as hybrid automatic retransmission request (HARD) based on the LLR transmitted from the symbol detector 311, and may reconstruct data (e.g., packet) by combining the data with that of a previous transmission. For example, the retransmission combiner 312 may store the data having an error obtained through an initial transmission to the memory device 320 instead of discarding the data, and then may reconstruct the data by combining the data of initial transmission to the memory device 320 with data that is retransmitted when the retransmission is made. As the number of bits used to represent the LLR increase, a decoding performance may be improved, whereas a calculation complexity and necessary memory space may increase. In high-speed wireless communication system such as 5G, the data processing device 310 needs to process data of about 7 gigabits per second (Gbps) in real-time, and thus, the electric power consumed by the memory device 320 and the memory interface IF may be largely increased. As described above with reference to accompanying drawings, the controller 316 may selectively reduce the power consumption in the memory interface IF and/or the memory device 320 by controlling the data converter 314, and the power consumption of the system 300 may be reduced by reducing unnecessary power consumption. Examples of the data converter 314 will be described below with reference to FIGS. 13 to 15.

Figure 13:
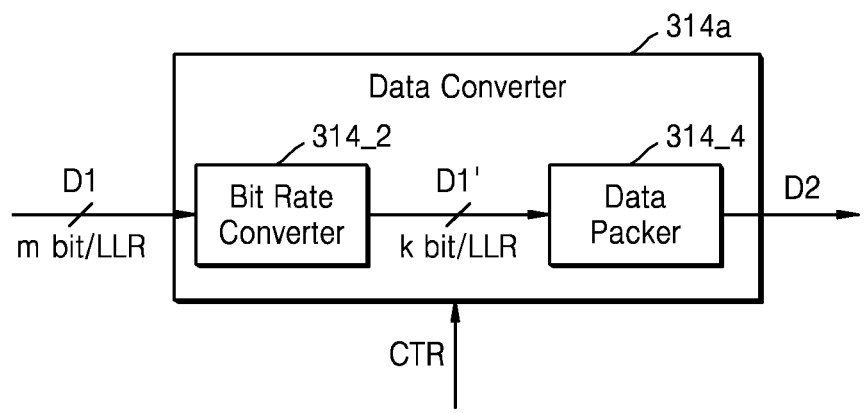
FIG. 13 is a diagram showing an example of a data converter of FIG. 12, according to an exemplary embodiment of the inventive concept.

FIG. 13 is a block diagram showing an example of the data converter 314 of FIG. 12, according to an exemplary embodiment of the inventive concept. As shown in FIG. 13, a data converter 314a generates the second data D2 from the first data D1, based on the control signal CTR. When the data converter 314a is enabled by the control signal CTR, the second data D2 has a size less than that of the first data D1; however, when the data converter 314a is disabled by the control signal CTR, the second data D2 is the same as the first data D1. The data converter 314a includes a bit-rate converter 314_2 (e.g., logic circuit) and a data packer 314_4 (e.g., logic circuit).

The bit-rate converter 314_2 may receive first data D1 including LLR expressed in m bits, and may generate converted first data D1' including LLR expressed in k bits (here, k≤cm, k and m are positive integers). The bit-rate converter 314_2 may generate the converted first data D1' from the first data D1 by using one of the plurality of conversion methods, based on the control signal CTR. Examples of the bit-rate converter 314_2 will be described later with reference to FIGS. 14A, 14B and 15.

The data packer 314_4 packs the converted first data D1' to generate the second data D2 having a size less than that of the converted first data D1'. In some embodiments, LLR included in the converted first data D1' may have a negative value, and k bits may include encoded bits. For example, as described later with reference to FIG. 14B, when the LLR in the converted first data D1' has a value that is one of −1, 0 and 1, the LLR is expressed in 2 bits including one encoded bit (k=3). However, since 2 bits may have four different values, and thus all of the values that may be expressed by 2 bits may not be used to represent three different values, e.g., −1, 0 and 1. That is, five LLRs may be expressed in 8 bits for representing $3^5=243$, instead of 10 bits, for example, five LLRs −1, 1, 0, −1, and 1 may be expressed by Equation 1 below.

$$(-1+1)*3^4+(1+1)*3^3+(0+1)*3^2+(-1+1)*3+(1+1)=65- \quad (1)$$

When the number of values that LLRs included in the converted first data D1' have is L and M LLRs are packed, a packed value may be expressed by Equation 2 below.

$$\left(LLR_{M-1}+\text{floor}\left(\frac{L}{2}\right)\right)*L^{M-1}+\ldots+\left(LLR_0+\text{floor}\left(\frac{L}{2}\right)\right)*L^0= \quad (2)$$

$$\sum_{i=0}^{M-1}\left(LLR_i+\text{floor}\left(\frac{L}{2}\right)\right)*L^i$$

In some embodiments, M in Equation 2 above is determined so that a value of $L^M$ may be close to 2P (P is a positive integer).

Figure 14A:
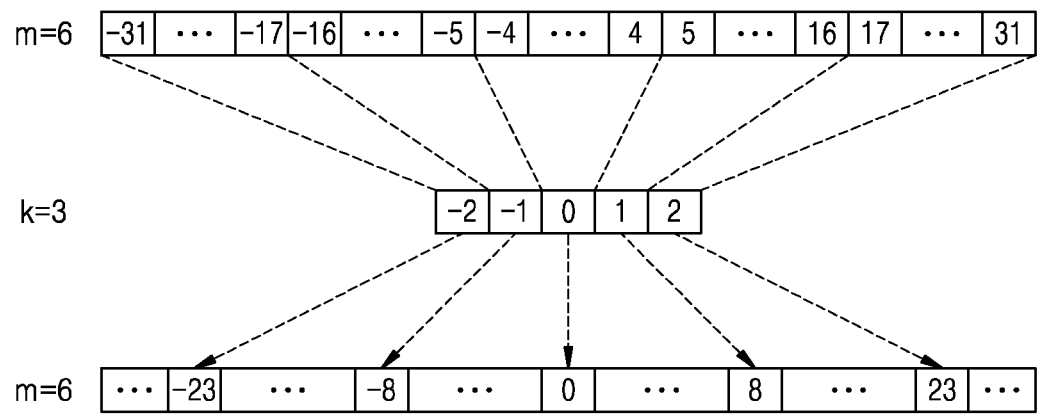
FIGS. 14A and 14B are diagrams showing examples of an operation of a bit-rate converter of FIG. 13, according to an exemplary embodiment of the inventive concept.
Figure 14B:
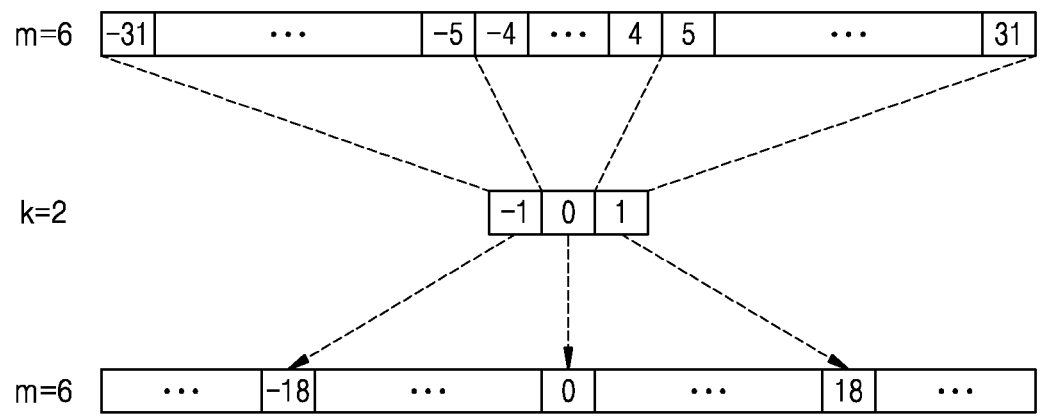

FIGS. 14A and 14B are diagrams showing examples of an operation of the bit-rate converter 314_2 in FIG. 13, according to exemplary embodiments of the inventive concept. As described above with reference to FIG. 13, the bit-rate converter 314_2 may generate the converted first data D1' including LLR expressed in k bits from the first data D1 including LLR expressed in m bits, based on the control signal CTR. Hereinafter, FIGS. 14A and 14B will be described with reference to FIG. 13, and overlapping descriptions will be omitted.

In some embodiments, the bit-rate converter 314_2 maps the LLR included in the first data D1 to the LLR included in the converted first data D1'. For example, as shown in FIG. 14A, the LLR included in the first data D1 may be expressed in 6 bits (m=6) including encoded bits, and the bit-rate converter 314_2 may map the LLR included in the first data D1 to the LLR expressed in 3 bits (k=3) including encoded bits. Accordingly, in the example of FIG. 14A, a size of the converted first data D1' corresponds to half the size of the first data D1. Also, as shown in FIG. 14B, the bit-rate converter 314_2 maps the LLR included in the first data D1 to the LLR expressed in 2 bits (k=2) including encoded bits. Accordingly, in the example of FIG. 14B, a size of the converted first data D1' corresponds to ⅓ of the size of the first data D1. The controller 316 of FIG. 12 may generate the control signal CTR according to a required power reduction amount, and the bit-rate converter 314_2 may map the LLR included in the first data D1 to the LLR of different bits according to the control signal CTR.

In some embodiments, the bit-rate converter 314_2 may generate the first data D1 by mapping data that is unpacked from the second data D2 read from the memory device 320 of FIG. 12. In the examples of FIGS. 14A and 14B, the retransmission combiner 312 may calculate the LLR of 6 bits (m=6), and thus the second data D2 stored in the memory device 320 may be inversely converted into the first data D1 by the data packer 314_4 and the bit-rate converter 314_2 of FIG. 13. Accordingly, as shown in FIG. 14A, the bit-rate converter 314_2 may map the LLR of 3 bits to the LLR of 6 bits, and the LLR of 3 bits may be mapped to five representative values, that is, −23, −8, 0, 8 and 23. Similarly, as shown in FIG. 14B, the bit-rate converter 314_2 may map the LLR of 2 bits to the LLR of 6 bits, and the LLR of 2 bits may be mapped to three representative values, that is, −18, 0 and 18. FIGS. 14A and 14B show examples of the mapping operation performed by the bit-rate converter 314_2, and the mapping may be performed between the LLRs of different bits from those of the LLRs shown in FIGS. 14A and 14B.

Figure 15:
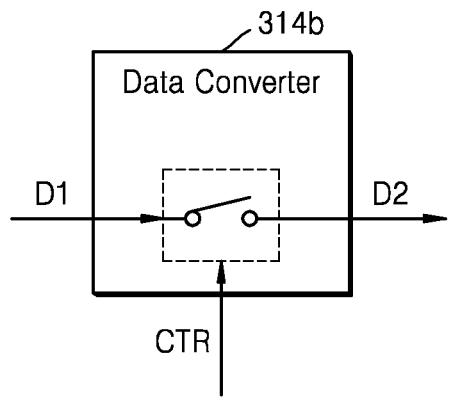
FIG. 15 is a diagram showing an example of a data converter of FIG. 12, according to an exemplary embodiment of the inventive concept.

FIG. 15 is a block diagram showing an example of the data converter 314 of FIG. 12, according to an exemplary embodiment of the inventive concept. In detail, FIG. 15 shows a data converter 314b performing data puncturing. In an exemplary embodiment of the inventive concept, the data converter 314 includes a logic circuit that calculates the second data D2 by performing some sort of reduction operation (e.g., data compression or data removal) on the first data D1 to generate the second data D2 when a state of the control signal CTR indicates the data converter 314 is to be enabled, or sets the second data D2 equal to the first data D1 when the state of the control signal CTR indicates the data converter 314 is to be disabled. Hereinafter, FIG. 15 will be described with reference to FIGS. 9 and 12.

As described above with reference to FIGS. 9 and 12, data received through the communication channel CH may include redundant information, and accordingly the data processing device 310 of FIG. 12 may reconstruct the data that is to be transmitted by the base station 210 even when some of the received data is omitted. Accordingly, in some embodiments, instead of using all of the LLRs included in the first data D1 generated by the retransmission combiner 312 of FIG. 12, the LLR or the symbol may be punctured to the level at which the data may be reconstructed, so as to reduce the power consumption of the memory interface IF and/or the memory device 320. To do this, the controller 316 may generate the control signal CTR including information about a puncturing pattern, and the data converter 314b may puncture the first data D1 based on the control signal CTR to generate the second data D2.

Figure 16:
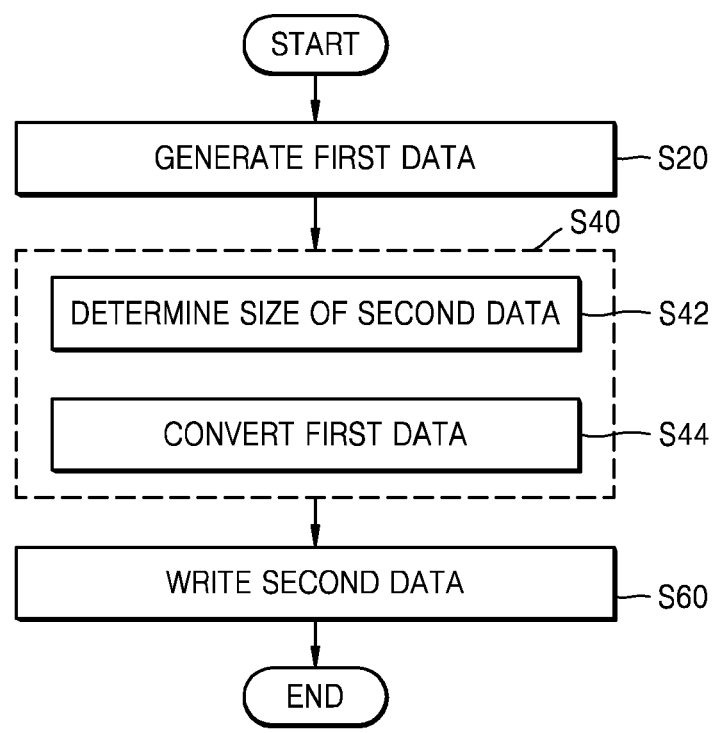
FIG. 16 is a flowchart illustrating a method of communicating with a memory device according to an exemplary embodiment of the inventive concept.

FIG. 16 is a flowchart illustrating a method of communicating with the memory device 120 according to an exemplary embodiment of the inventive concept. In detail, FIG. 16 illustrates a method of writing data on the memory device. For example, the method illustrated in FIG. 16 may be performed by the data processing device 110 communicating with the memory device 120 of FIG. 1 via the memory interface IF. Hereinafter, FIG. 16 will be described with reference to FIG. 1.

Referring to FIG. 16, an operation of generating the first data D1 is performed in operation S20. The first data D1 may denote data to be stored in the memory device 120. For example, data processors 112 included in the data processing device 110 may generate the first data D1 to be stored in the memory device 120. In some embodiments, the first data D1 may be generated by one data processor, and in some other embodiments, the first data D1 may include data generated by two or more data processors.

In operation S40, an operation of generating the second data D2 from the first data D1 is performed. As described above with reference to FIG. 1, the second data D2 may denote data written to the memory device 120. In order to reduce power consumption of the memory interface IF and/or the memory device 120, the second data D2 may have a size that is less than that of the first data D1. As shown in FIG. 16, operation S40 includes operation S42 and operation S44.

In operation S42, an operation of determining the size of the second data D2 is performed. For example, the controller 116 may determine whether to convert the first data D1 based on the information described above with reference to the drawings, and may determine a required size of the second data D2. The controller 116 may determine one of the plurality of conversion methods, based on the determined size of the second data D2, and may control the data converter 114 according to the determined conversion method.

In operation S44, an operation of converting the first data D1 is performed. For example, the data converter 114 may be enabled in response to the control signal CTR transmitted from the controller 116, and may generate the second data D2 by converting the first data D1. In some embodiments, the data converter 114 may support a plurality of conversion methods and may generate the second data D2 based on one of the plurality of conversion methods according to conversion method information included in the control signal CTR.

In operation S60, an operation of writing the second data D2 is performed. For example, when the data converter 114 is enabled, the second data D2 may have a size less than that of the first data D1, and accordingly, the electric power consumed by the memory interface IF and/or the memory device 120 while writing the second data D2 may be reduced, and the electric power consumed by the memory interface IF and/or the memory device 120 while reading the second data D2 stored in the memory device 120 may be reduced.

While the inventive concept has been particularly shown and described with reference to exemplary embodiments thereof, it will be understood that various changes in form and details may be made therein without departing from the spirit and scope of the disclosure.

What is claimed is:

1. A data processing device configured to communicate with a memory device via a memory interface, the data processing device comprising:
   a plurality of data processors configured to generate first data, where each data processor is configured to output an index that identifies the data processor currently providing the first data;
   a data converter configured to generate second data to be written to the memory device from the first data based on a control signal; and
   a controller configured to estimate an amount of power to be consumed by at least one of the memory device or the memory interface based on the index and the first data and generate the control signal to indicate the second data is to have a size that is less than a size of the first data when the estimated amount of power is greater than a reference value.

2. The data processing device of claim 1, wherein the controller is further configured to disable the data converter and the data processing device writes the first data to the memory device via the memory interface.

3. The data processing device of claim 1, further comprising a lookup table that stores information about first electric power consumed by at least one of the memory device or the memory interface by the second data that is the same as the first data, wherein the controller is configured to control the data converter based on the information about the first electric power.

4. The data processing device of claim 3, wherein the information comprises pieces, and each piece respectively corresponds to the plurality of data processors, and the controller is configured to control the data converter based on the pieces of the information.

5. The data processing device of claim 1, further comprising a lookup table that stores information about first electric power consumed by at least one of the memory device or the memory interface by the second data having a size less than a size of the first data, wherein the controller is configured to control the data converter based on the information about the first electric power.

6. The data processing device of claim 5, wherein the data converter is configured to generate the second data from the first data according to one of a plurality of conversion methods, the information comprises pieces respectively corresponding to the plurality of conversion methods, and the controller is configured to control the data converter based on the pieces of the information.

7. The data processing device of claim 1, wherein the controller receives a mode signal indicating a power mode of the data processing device and is configured to control the data converter based on the mode signal.

8. The data processing device of claim 7, wherein the data converter is configured to generate the second data from the first data according to one of a plurality of conversion methods, and the controller further receives a type signal indicating one of the plurality of conversion methods and is configured to control the data converter further based on the type signal.

9. The data processing device of claim 1, wherein the controller is configured to obtain memory power information corresponding to at least one of the power consumption of the memory device or the memory interface and to control the data converter based on the memory power information.

10. The data processing device of claim 1, wherein the controller is configured to obtain interface bandwidth information corresponding to an available bandwidth of the memory interface and to enable the data converter when the available bandwidth is less than a value set in advance.

11. The data processing device of claim 1, wherein the controller is configured to obtain memory space information corresponding to an available space of the memory device and to enable the data converter when the available space is less than a reference value set in advance.

12. The data processing device of claim 1, wherein the data converter is configured to generate the second data by mapping the first data to the second data based on a mapping table.

13. The data processing device of claim 1, wherein the data converter is configured to generate the second data by reducing a bit width of the first data.

14. The data processing device of claim 1, wherein the data converter is configured to generate the second data by puncturing the first data.

15. A method of communicating with a memory device via a memory interface, the method comprising:
  generating, by one of a plurality of data processors of a data processing device, first data to be stored in the memory device and an index identifying the one data processor currently providing the first data;
  estimating, by a controller of the data processing device, an amount of power to be consumed by at least one of the memory device or the memory interface based on the index and the first data;
  converting, by a data converter of the data processing device, the first data to second data having a size less than a size of the first data, when the estimated amount of power is greater than a reference value; and
  writing, by the data processor, the second data to the memory device.

16. The method of claim 15, further comprising the data processor writing the first data to the memory device when the estimated amount of power is not greater than the reference value.

17. The method of claim 15, further comprising disabling the data converter and writing the first data to the memory device during a normal mode.

18. The method of claim 15, wherein the data converter performs the converting in response to a control signal from the controller indicating the size of the second data is to be less than the size of the first data.

\* \* \* \* \*